United States Patent [19]
Grützediek et al.

[11] Patent Number: 5,779,425
[45] Date of Patent: *Jul. 14, 1998

[54] PROCEDURE AND FACILITY FOR HANDLING AND TRANSPORT OF WAFERS IN ULTRA-CLEAN ROOMS

[76] Inventors: Hartmut Grützediek, An der Klosterheck 16; Joachim Scheerer, Am Fort Weisenau 38, both of D-55130 Mainz, Germany

[*] Notice: The term of this patent shall not extend beyond the expiration date of Pat. No. 5,718,552.

[21] Appl. No.: 758,355

[22] Filed: Dec. 3, 1996

Related U.S. Application Data

[63] Continuation of Ser. No. 641,274, Apr. 30, 1996, which is a continuation of Ser. No. 215,185, Mar. 21, 1994, abandoned.

[30] Foreign Application Priority Data

Mar. 22, 1993 [DE] Germany ............... 43 09 092.3

[51] Int. Cl.⁶ .................................................. B65G 49/07
[52] U.S. Cl. ....................................... 414/416; 414/786
[58] Field of Search ............................. 414/217, 274, 414/416, 937, 939, 946, 941, 608, 786; 901/47

[56] References Cited

U.S. PATENT DOCUMENTS

| | | | |
|---|---|---|---|
| 4,643,629 | 2/1987 | Takahashi et al. | 414/937 X |
| 4,649,830 | 3/1987 | Tanaka | 414/940 X |
| 4,664,578 | 5/1987 | Kakehi | 414/941 X |
| 4,682,927 | 7/1987 | Southworth et al. | 414/940 X |
| 4,722,659 | 2/1988 | Hoyt, III et al. | 414/940 X |
| 4,728,246 | 3/1988 | Mello | 414/940 X |
| 4,744,712 | 5/1988 | Mitchell | 414/940 X |
| 4,770,590 | 9/1988 | Hugues et al. | 414/937 X |
| 4,773,687 | 9/1988 | Bush et al. | 414/941 X |
| 4,806,057 | 2/1989 | Cay et al. | 414/940 X |
| 4,812,629 | 3/1989 | O'Neil et al. | 414/274 X |
| 4,833,306 | 5/1989 | Milbrett | 414/940 X |
| 5,030,057 | 7/1991 | Nishi et al. | 901/47 X |
| 5,048,164 | 9/1991 | Harima | 414/940 X |
| 5,058,526 | 10/1991 | Matsushita et al. | 414/940 X |
| 5,064,337 | 11/1991 | Asakawa et al. | 414/940 X |
| 5,163,802 | 11/1992 | Poinelli | 414/940 X |
| 5,203,445 | 4/1993 | Shiraiwa | 414/940 X |
| 5,215,423 | 6/1993 | Schulte-Hinsken et al. | 901/47 X |
| 5,280,179 | 1/1994 | Pryor et al. | 90/47 X |
| 5,284,412 | 2/1994 | Shiraiwa et al. | 414/940 X |
| 5,323,327 | 6/1994 | Carmichael et al. | 414/274 X |
| 5,340,261 | 8/1994 | Oosawa et al. | 414/937 X |
| 5,372,471 | 12/1994 | Wu | 414/940 X |
| 5,464,313 | 11/1995 | Ohsawa | 414/940 X |

FOREIGN PATENT DOCUMENTS

| | | | |
|---|---|---|---|
| 2-53640 | 10/1990 | Japan | 414/937 |
| 4-79253 | 3/1992 | Japan | 414/937 |
| 5-55344 | 3/1993 | Japan | 414/940 |
| 294410 | 11/1993 | Japan | 414/940 |

*Primary Examiner*—David A Bucci
*Attorney, Agent, or Firm*—Frishauf, Holtz, Goodman, Langer & Chick, P.C.

[57] ABSTRACT

A technique for handling discs, such as wafers for integrated circuits, which must be processed in ultra-clean rooms and which are transported to various workstations for processing. A horizontally extended rail has storage positions therealong where standard commercial carriers are positioned which contain vertically standing wafers. A lifting device can lift any carrier over neighboring carriers and moves it to a carrying basket located on an extension of the rail. The carrying basket is then turned by 90° so that the vertical wafers lie horizontally. A tongue-shaped device can be moved under any of these wafers for removal thereof from the basket and subsequent transport to a workstation, and return.

35 Claims, 2 Drawing Sheets

PROCEDURE AND FACILITY FOR HANDLING AND TRANSPORT OF WAFERS IN ULTRA-CLEAN ROOMS

This is a continuation of application Ser. No. 08/641,274 filed Apr. 30, 1996, which is a Continuation of application Ser. No. 08/215,185 filed Mar. 21, 1994, now abandoned.

BACKGROUND OF THE INVENTION

This invention concerns a procedure for handling plate-form discs which must be processed in ultra-clean rooms and which have to be transported to various stations as is the case in particular for wafers for integrated circuits. In the production of wafers several pre-treatments and several post-treatments are usually necessary. If the processing stations are integrated in the main working room, they make it more difficult to keep the room clean. If the processing stations are external, it is difficult to bring the wafers in a clean state into the main working room.

Although this invention can be used for other plate-form discs too, it is described here exclusively in relation to the example of handling and transport of wafers.

In order to subject the wafers to various processing steps such as one or several cleaning steps, coating steps, surface treatment, etc., they are usually brought to the respective processing stations individually or in conventional commercial carriers in which they stand vertically. Modern wafer production requires clean room class 1 or even 0.1 for this purpose. It is extremely difficult to maintain this degree of cleanliness in large rooms, especially if moving machinery parts are operating in this room or persons working therein have to move around. Thus it is appropriate to carry out the unavoidable preliminary and subsequent tasks on the wafers in rooms which are separated from the main processing station, because it is then easier to keep the main processing room free from dust. However, separation of the stations for pre-processing and post-processing entails the disadvantage that the wafers must be introduced into the main room and taken out of it again under ultra-clean conditions.

SUMMARY OF THE INVENTION

It is the purpose of this invention to create a procedure for handling wafers and similar plate-form discs requiring a high degree of cleanliness and for transporting them to work stations in ultra-clean rooms, involving lower costs, less effort and permitting universal application and programmed control, and to specify a facility for carrying out the procedure.

Thus the invention also provides a facility for carrying out the procedure of the invention, whereby this facility serves for handling plate-form discs, in particular wafers for integrated circuits, in ultra-clean rooms with at least one workstation. The facility according to the invention comprises a chamber which is maintained under ultra-clean room conditions, for example with clean room class 1 or 0.1, and in which a straight horizontally extended rail is provided which has storage positions for depositing standard commercial carriers containing vertically standing wafers, whereby their disc plane is oriented vertically with respect to the longitudinal direction of the rail. The chamber furthermore contains a lifting device which is movable in a single working plane, the xy-plane, on a cross-slide whereby the working plane passes essentially vertically through the longitudinal direction of the rail. This lifting device has a supporting device, preferentially in the from of a fork, which extends at right angles, i.e., in the z-direction, with respect to the working plane and can grasp under the floor of a carrier to lift the carrier from its storage place. In the course of an upward movement in the y-direction the carrier is raised through a distance greater than the height of a carrier so that in the course of a subsequent movement in the longitudinal direction of the rail, i.e., in the x-direction, it can be lifted over neighboring carriers on the rail in order to be moved to a carrying basket which is located on the extension of the rail but beyond the latter. If the carrier which is to be transported is the first one on the rail, it is also possible to raise it only slightly and then to transport it to the carrying basket. In the carrying basket the carrier is lowered by movement of the cross-slide in the y-direction. The carrying basket is then turned through 9020 by a turning device on whose shaft it is mounted, such that the formerly vertical wafers now lie horizontal in the carrier turned through 90°. A working device in the form of a tongue can then be moved to the carrying basket with the wafers in such a way that the tongue grasps under a horizontally lying wafer or grips it by suction vacuum from above or in some other way, pulling it out of the carrier and taking it to a workstation within the chamber. The tongue deposits the wafer at such a workstation for processing.

After processing, the tongue can lift up this wafer and bring it in an analogous manner to further workstations, or it can bring it back directly to the carrier and take another wafer from the carrier which is then processed too.

The tongue is mounted preferentially on the xy-cross-slide and is controlled too by the control system for the cross-slide.

When all the wafers of a carrier according to a predefined program have been processed, the turning device turns the carrying basket back through 90° so that the lifting device can then take the carrier with the processed wafers back to its storage place.

When the device according to the invention is used for carrying out the preliminary tasks before the main treatment of a wafer, the wafer after pre treatment at the workstation in the chamber can be introduced into the main processing room through an airlock. After processing in the main room, the wafer is either taken out of the main processing room, or back through the airlock into the chamber of the device according to the invention, for post treatment.

There is no limitation on the number of storage places on the rail, and it is also possible to provide any desired number of workstations inside the chamber. The greater the number of storage places for carriers provided, the longer must be the rail and thus the longer becomes the chamber. For a shorter chamber, a single exhaust suction device suffices to maintain freedom from dust inside the chamber. If necessary, several adjacent exhaust suction devices in tandem must be provided for long chambers.

The implementation forms of the device according to the invention clearly show that the device for handling and transporting wafers permits standardization in a simple way, in that the device comprises a chamber with a certain number of storage places for carriers and a certain number of workstations, of which only a portion is used under process control as required when no smaller standard chamber is available. Such a chamber can be connected to the main processing room via an airlock, for pre-processing or post-processing operations.

The high degree of cleanliness inside the chamber can be maintained relatively easily because all driving devices are placed outside the chamber and only the xy-cross-slide for the lifting device and the working tongue are moved inside the chamber, and a rotating bushing from the exterior is used for tilting the carrying basket between its two end stop positions. Furthermore, in special cases it is even possible to attach a gripper to the cross-slide so that no additional drive is required for this gripper. Only an actuating cylinder must be moved inside the chamber for moving the airlock, whereby the drive unit can be mounted outside the chamber.

Movement of the cross-slide of the lifting device is appropriately carried out with two servo motors controlled in the x- and y-direction.

The working device is appropriately constructed in the form of a double-walled supporting tongue forming a pocket, which can be evacuated and which has a hole on the upper or lower side. When vacuum is applied, a wafer is held against the hole on the tongue by the reduced pressure. The vacuum inside the supporting tongue is controlled in the familiar way via a reservoir vacuum with a vacuum line in which a control valve is located. When a wafer is held on the underside of the tongue by vacuum, it can be deposited on the station after arrival over a workstation simply by switching off the vacuum. If a wafer must be brought to a workstation with the aid of a gripper, it is deposited by the tongue and then taken up again by the gripper.

The working head on the cross-slide of the lifting device is a U-shaped bent arm whose U-plane is at right angles to the xy-workplane and at right angles to the longitudinal direction of the rail. The upper leg of the "U" constitutes the supporting device which can lift a carrier. The center leg of the "U" is vertical with clearance in front of the carrier walls. The bottom leg of the "U" is directly connected to the cross-slide. This arrangement has the advantage that it does not interfere with the movement of the cross-slide or of the supporting device on the rotating bushing for the carrying basket.

The connection between the supporting device itself, i.e., usually a fork which grasps under the floor of a carrier, with the drive for the cross-slide, may be shaped differently, as long as this connection does not come into conflict with the rotating bushing for tilting the carrying basket.

A particular advantage of this invention is that encoded information on the base or floor of a carrier can be recognized and evaluated for identification and control of the carrier. A hole coding on a rib on the floor of a carrier can be sensed in a known manner by a known sensing device. The presence or absence of an opening in the floor rib of the carrier can be recognized using light of various wavelengths, lasers, long wavelength electromagnetic radiation or other means. For this purpose, a light emitting diode and receiver diode combination, or a transmitter/receiver and emitter/sensor pair is located in opposite walls of a slot in the supporting device, e.g., in the two prongs of a take-up form or on the carrier edge. Preferentially, the same numbers of pairs are provided in a row, as the number of holes corresponding to the code.

The sensed code signals are used preferentially in digitized form.

A further digitization of control signals is obtained in a simple manner when stepping motors are used for moving the cross-slide and the rotating device for the carrying basket. The entire control of handling and transport of carriers and wafers inside the chamber can easily be carried out with a process computer, making possible a completely automated action sequence of the work steps inside the chamber.

BRIEF FIGURE DESCRIPTION

The invention will be explained in more detail below with reference to the attached drawings.

DETAILED DESCRIPTION

In the device according to the invention, the chamber which forms a clean room of class 1 or 0.1 in the known manner contains a rail 1 with storage places A, B, C, D and E for carriers a, b, c, d and e in which wafers 2 stand vertically. These carriers with wafers have been brought into the chamber under dust-free conditions via an airlock.

Figure 1:
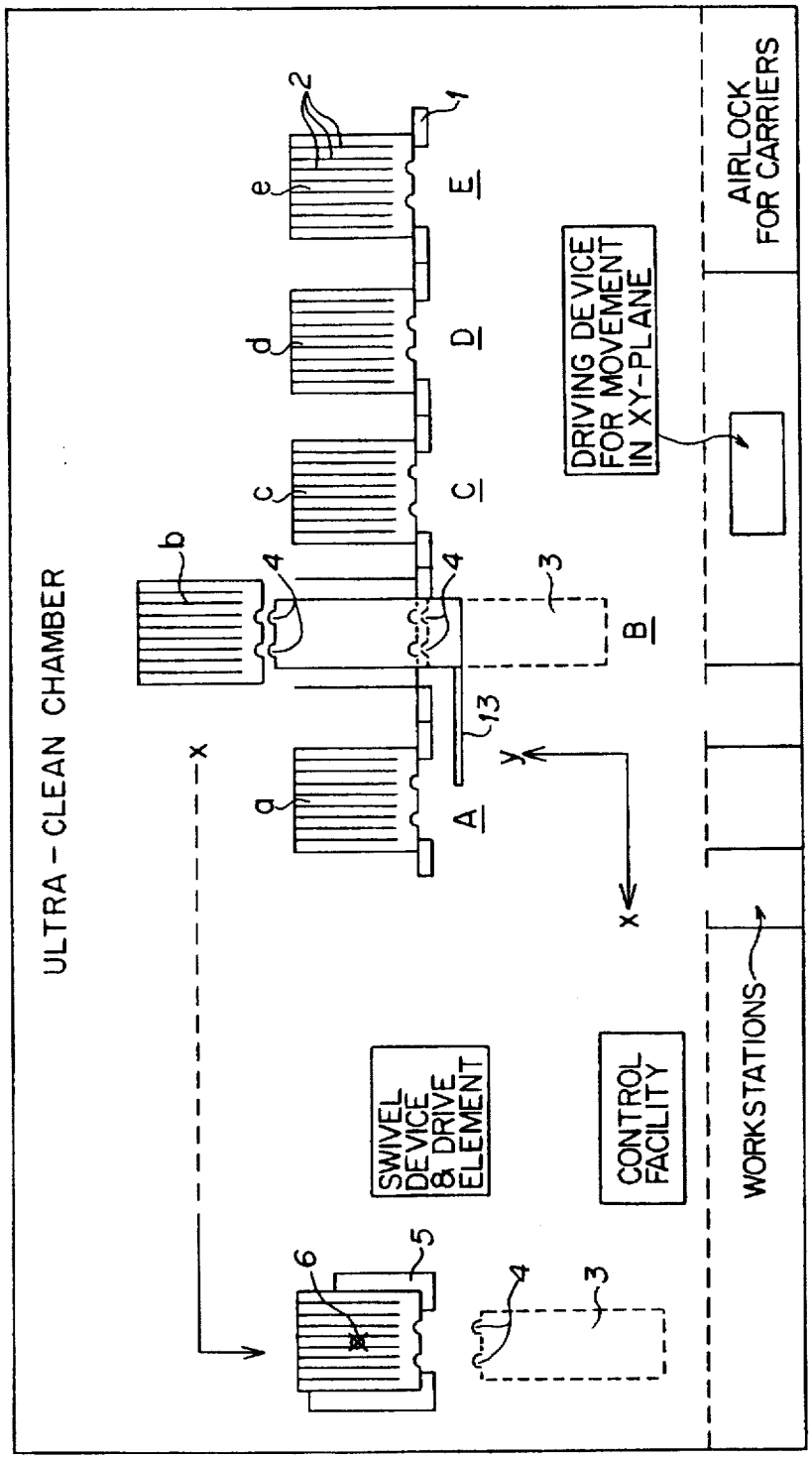
FIG. 1 is a schematic depiction to explain transport of a carrier to the carrying basket with the lifting device.

A lifting device for carriers comprises a U-shaped arm 3, one of whose legs constitutes a supporting device in the form of a fork 4. Calling the horizontal longitudinal direction of the rail 1 the x-direction and the vertical, i.e., the elevation direction in which a carrier is lifted, the y-direction, then the xy-plane (corresponding to the plane of the paper in the drawing) is the actual working plane. The U-shaped arm 3 extends at right angles to the working plane and at right angles to the longitudinal direction of the rail (i.e., at right angles to the x-direction), thus it extends in the yz-plane. In FIG. 1 the middle leg of the "U" is shown as a rectangle viewed from above, the supporting device 4 forms the upper leg of the "U" and the lower leg of the "U" establishes a connection to a xy-cross-slide. The U-shaped arm 3 can be moved in the x-direction and in the y-direction controlled by this cross-slide.

Arm 3 fits through a forwardly directed (i.e. out of the paper) opening 1a in rail 1. Opening 1a is U-shaped and has upwardly tapered posts 1b, with an inwardly slanted surface, at its four corners for adjusting the carrier into position accurately as it is lowered onto rail 1.

FIG. 1 shows in continuous line the U-shaped arm 3 which has lifted up a carrier b from the storage position B through a distance greater than the height of the carrier walls. The broken line indicates the position of the U-shaped arm 3 before the lifting process.

In the next working step the cross-slide is moved in the x-direction until the carrier b resting on the U-shaped arm 3 is above a carrying basket 5. By moving the cross-slide downwards in the y-direction, the U-shaped arm 3 with the carrier on it lowers to such an extent that the carrier is deposited in the carrying basket 5. The U-shaped arm 3 is moved further downwards in the y-direction to avoid impediment of the carrying basket 5 in the following swivel process. By swiveling the carrying basket 5 about a turning axis 6 in the z-direction, the carrier is turned through 90° in the carrying basket so that the wafers come to lie horizontal.

The turning axis 6 is located approximately in the center of the carrying basket to ensure that vibration of the wafers is minimized during the swivel operation.

Figure 2:
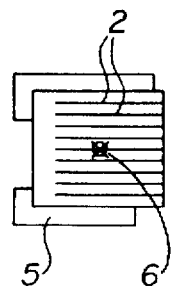
FIG. 2 shows the carrying basket with a carrier after the tilting operation.

The turning device for the carrying basket 5 has a simple construction because it only has to turn the carrying basket through 90° between two end stops. When the wafers are in horizontal position as shown in FIG. 2, a working device, e.g., in the form of a flat tongue, can be moved between the end of the rail 1 and the carrying basket 5 such that it takes a wafer out of the carrier. The encoding of the wafer is simple because it corresponds to the height of the wafer within the carrier.

Figure 3:
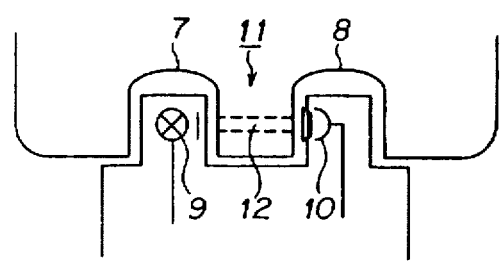
FIG. 3 is an enlarged view of a floor section of a carrier with engaged fork of the lifting device.

FIG. 3 shows with an enlarged scale the floor of a carrier which has the notches 7 and 8 into which the fork 4 of the U-shaped arm 3 engages. The wall parts of the fork prongs contain a light source 9 and a receiver 10. The receiver detects a light signal when a hole 12 is present in the ridge 11 on the carrier floor. A carrier can be encoded with a row of holes in the ridge 11. This code can be read by a row of emitter/receiver pairs preferentially using a combination of light emitting diodes and receiver diodes.

Because each carrier can be recognized by its code on its floor and each wafer in a carrier can be recognized by its height before taking it out of the carrier and placing it into the carrying basket 5 for the processing steps, every wafer in the chamber of the device according to the invention is individually identifiable. Thus it is possible to treat each wafer individually under automated control according to a predefined program.

Figure 4:
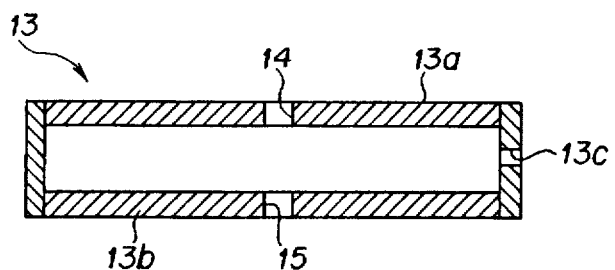
FIG. 4 is a cross section taken through a longitudinal center line of tongue 13 shown in FIG. 1.
Figure 5:
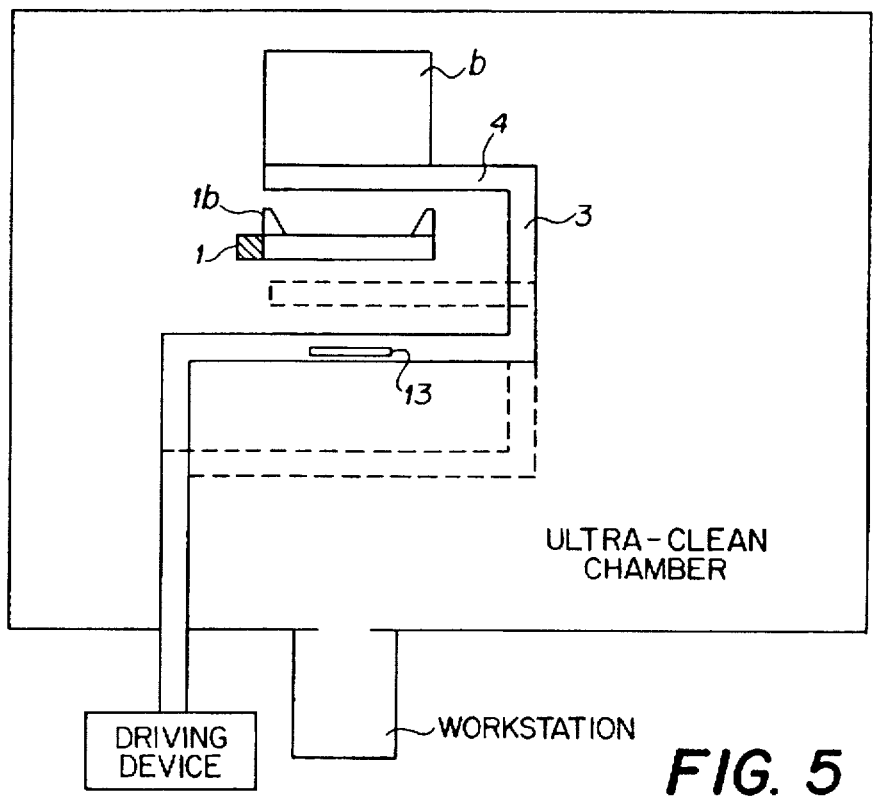
FIG. 5 is a left side view of the arrangement depicted in FIG. 1 showing rail 1 in cross-section, and U-shaped arm 3 in its carrier lifting and transporting position is shown by solid lines, and in a non-carrier engaging mode by broken lines.

On the U-shaped arm 3 a supporting tongue 13 is mounted as working device such that its principal plane is horizontal as shown in FIG. 1 so that it can grasp the wafers 2 (FIG. 2) lying horizontal in the turned over carrying basket 5 and take out a wafer. FIG. 4 shows double walled tongue 13 as having upper and lower walls 13a and 13b, an evacuation opening 13c for creating a vacuum to produce suction through opening 14 in upper wall 13a and/or opening 15 in lower wall 13b. Either one or both of openings 14 and 15 can be provided. Takeout of individual wafers and their transport within the chamber is controlled too via the controlling device for the xy-cross-slide, through the connection of the supporting tongue 13 via the U-shaped arm 3 to the xy-cross-slide. The possibility of relying on the use of a gripper is depicted in FIG. 1 by a schematic representation of gripper 16 attached in the working plane to working head 3.

In this arrangement the workstations too lie in the xy-plane.

The procedure described with reference to FIG. 1, in which a certain carrier b is taken from the storage position B, lifted through a distance greater than the height of a side-wall of a carrier, to lift it over the carrier a in the depicted case and then to further transport it in the x-direction to the carrying basket 5, from where it is returned in reverse sequence of events to its resting position B after processing of its wafers, can also be modified as follows:

The first carrier a is raised slightly, brought in the x-direction to the carrying basket 5 and then lowered. As shown in FIG. 1, for this purpose the height of the front edge of the carrying basket 5 is less than the height of the rear edge and less than the side-wall of a carrier. While the wafers of the carrier a are being processed, the cross-slide takes the lifting device back to the rail and lets the carriers b, c, d and e advance by one position in cyclic sequence, thus to the positions A, B, C and D. Position E remains empty. After processing the carrier a, it is placed in the empty position E. Operation with a simpler control program is possible in this cyclic processing of the waiting carriers.

What is claimed is:

1. Method to handle, under ultra-clean conditions, plate-form discs for processing by workstations located within a room, comprising the steps of:

maintaining a chamber under ultra-clean conditions;

supporting a plurality of carriers, respectively, on a plurality of support stations mounted in said chamber in sequential alignment extending along a horizontal, or X, direction, each of which carriers stores therein a plurality of the plate-form discs, said carriers being brought to rest on said support stations by motion along a vertical, or Y, direction, said X and Y directions defining a working plane within said chamber;

moving said carriers in only said working plane within said chamber;

providing access for said plate-form discs to at least one of the workstations through an opening in said chamber located within said working plane; and transporting individual ones of the plate-form discs in only said working plane between said carriers and said accessible workstation.

2. Method to handle, under ultra-clean conditions, plate-form discs for processing by workstations located within a room, comprising the steps of:

maintaining a chamber under ultra-clean conditions;

supporting a plurality of carriers, respectively, on a plurality of support stations mounted in said chamber, each of which carriers stores a plurality of the plate-form discs, wherein each of the carriers carries a code unique thereto;

moving said carriers within said chamber with a carrier transporting mechanism;

providing access for said plate-form discs to at least one of the workstations through an opening in said chamber;

transporting individual ones of the plate-form discs within said chamber between said carriers and said accessible workstation with a disc transporting mechanism;

reading the code on each of the carriers with a detection means; and mounting at least two from among said carrier transporting mechanism, said disc transporting mechanism and said detection means on a working head movably installed in said chamber.

3. Method to handle, under ultra-clean conditions, plate-form discs for processing by workstations located within a room, comprising the steps of:

maintaining a chamber under ultra-clean conditions;

supporting a plurality of carriers, respectively, with a plurality of support stations mounted in said chamber in sequential alignment extending along a horizontal, or X, direction, each of which carriers stores a plurality of the plate-form discs lying therein along a vertical, or Y, direction, said X and Y directions defining a working plane within said chamber;

providing a working head movably installed in said chamber and having a lifting portion adapted for engaging and transporting said carriers;

providing a receiving unit mounted within said chamber spaced from said plurality of support stations and in said working plane for securely retaining one of said carriers when delivered thereto by said working head;

moving said working head in only said working plane with a transport mechanism comprising a first driving means mounted outside of said chamber and coupled to said working head for transporting said carriers between said support stations and said receiving unit;

providing access for the plate-form discs to a workstation through an opening in said chamber within said working plane; and transporting the plate-form discs between said carrier retained by the receiving unit and said workstation by a disc transport means mounted on said working head.

4. The method of claim 3, wherein said receiving unit is tiltable, and further comprising the step of rotating the receiving unit by 90° in said working plane with second driving means mounted outside of said chamber and coupled to said receiving unit, wherein the driving means positions said receiving unit at only two stationary locations, one of said locations being for retaining one of said carriers so that the plate-form discs therein are vertical, and the other of said locations being for placing said plate-form discs horizontal.

5. Apparatus to handle, under ultra-clean conditions, plate-form discs for processing by workstations located within a room, comprising:

a chamber maintained under ultra-clean conditions;

a plurality of support stations mounted in said chamber in sequential alignment extending along a horizontal, or X, direction for supporting a plurality of carriers, respectively, each of which stores therein a plurality of the plate-form discs, said carriers being brought to rest on said support stations by motion along a vertical, or Y, direction, said X and Y directions defining a working plane within said chamber;

a carrier transporting means for moving said carriers in only said working plane within said chamber;

an opening in said chamber within said working plane through which at least one of the workstations is accessible to said plate-form discs delivered thereto; and disc transporting means for transporting individual ones of the plate-form discs in only said working plane between said carriers and said accessible workstation.

6. The apparatus of claim 5, wherein said disc transporting means comprises:

a receiving unit mounted within said chamber spaced from said support stations and in said working plane for securely retaining one of said carriers when delivered thereto by said carrier transporting means.

7. The apparatus of claim 6, wherein said disc transporting means comprises a tongue for selectively handling any of the discs stored in the one of the carriers being retained by said receiving unit.

8. The apparatus of claim 7, wherein said receiving unit is tiltable, and said disc transporting means further comprises driving means for rotating the receiving unit by 90° in said working plane to position said receiving unit at only two stationary locations, one of said locations being for retaining said one of said carriers so that the plate-form discs therein are vertical, and the other of said locations being for placing said plate-form discs horizontal.

9. The apparatus of claim 6, wherein said carrier transporting means comprises a lifting device for disengaging the carriers from said support stations.

10. The apparatus of claim 9, wherein said disc transporting means comprises a tongue for selectively handling any of the discs stored in the one of the carriers being retained by said receiving unit.

11. The apparatus of claim 9, wherein said lifting device and said tongue are mounted on a working head, and wherein said carrier transporting means and said disc transporting means have a common driving mechanism which moves the carriers within the chamber and the discs between said receiving unit and the accessible workstation.

12. The apparatus of claim 5, wherein said carrier transporting means and said disc transporting means have a common driving mechanism which moves the carriers within the chamber and the discs between said receiving unit and the accessible workstation.

13. Apparatus to handle, under ultra-clean conditions, plate-form discs for processing by workstations located within a room, comprising:

a chamber maintained under ultra-clean conditions;

a plurality of support stations mounted in said chamber for supporting a plurality of carriers, respectively, each of which stores a plurality of the plate-form discs, wherein each of the carriers carries a code unique thereto;

a carrier transporting mechanism for moving said carriers within said chamber;

an opening in said chamber through which at least one of the workstations is accessible to said plate-form discs delivered thereto;

a disc transporting mechanism for transporting individual ones of the plate-form discs within said chamber between said carriers and said accessible workstation; and detection means for reading the code on each of the carriers;

wherein at least two from among said carrier transporting mechanism, said disc transporting mechanism and said detection means are mounted on a working head movably installed in said chamber.

14. The apparatus of claim 13, wherein said working head has said carrier transporting mechanism and said disc transporting mechanism mounted thereto.

15. The apparatus of claim 13, wherein said working head has said carrier transporting mechanism and said detection means mounted thereto.

16. The apparatus of claim 13, wherein said working head has said carrier transporting mechanism, said disc transporting mechanism and said detection means mounted thereto.

17. The apparatus of claim 13, wherein said carrier transporting mechanism comprises a lifting device for disengaging the carriers from said support stations, and a driving mechanism coupled to said lifting device.

18. The apparatus of claim 17, wherein said disc transporting mechanism comprises a tongue for selectively handling discs stored in said carriers, and a driving mechanism coupled to said tongue.

19. The apparatus of claim 18, wherein said detection means comprises a sensor responsive to a code on each of the carriers, and a driving mechanism coupled to said sensor.

20. The apparatus of claim 19, further comprising a driving mechanism coupled to said working head.

21. The apparatus of claim 20, wherein the driving mechanism coupled to said working head is common to the driving mechanism for said lifting device, said tongue and said sensor.

22. The apparatus of claim 13, further comprising a driving mechanism coupled to said working head.

23. Apparatus to handle, under ultra-clean conditions, plate-form discs for processing by workstations located within a room, comprising;

a chamber maintained under ultra-clean conditions;

a plurality of support stations mounted in said chamber for supporting a plurality of carriers, respectively, each of which stores a plurality of the plate-form discs;

a carrier transporting mechanism for moving said carriers within said chamber, said carrier transporting mechanism comprising a lifting device for engaging said carriers;

an opening in said chamber through which at least one of the workstations is accessible to said plate-form discs delivered thereto;

a disc transporting mechanism for transporting individual ones of the plate-form discs within said chamber between said carriers and said accessible workstation, said disc transporting mechanism comprising a tongue for engaging each one of said discs stored in said carriers;

driving means located outside said chamber and coupled to said disc transporting mechanism and said carrier transporting mechanism, said driving means comprising a driving mechanism coupled to said lifting device and to said tongue;

wherein said driving means coupled to the carrier transporting mechanism and the disc transporting mechanism includes a common driving mechanism therefor; and wherein the plate-form discs are stored vertically in the carriers, and wherein said disc transporting mechanism further comprises a swiveling mechanism comprising a tiltable receiving unit mounted within said chamber spaced from said support stations for securely retaining one of said carriers when delivered thereto by said carrier transporting mechanism, an other driving means mounted outside of said chamber for vertically rotating the receiving unit by 90° to position said receiving unit at only two stationary locations, one of said locations being for retaining said one of said carriers so that the plate-form discs therein are vertical, and the other of said locations being for placing said plate-form discs horizontal to enable access thereto by said tongue.

24. The apparatus of claim 23, wherein said other driving means is located outside said chamber.

25. The apparatus of claim 24, wherein each of the carriers carries a code unique thereto, and further comprising detection means for reading the code on each of the carriers, and said driving means drives said detection means.

26. The apparatus of claim 25, wherein said driving means is located outside said chamber.

27. Apparatus to handle, under ultra-clean conditions, plate-form discs for processing by workstations located within a room, comprising:

a chamber maintained under ultra-clean conditions;

a plurality of support stations mounted in said chamber for supporting a plurality of carriers, respectively, each of which stores a plurality of the plate-form discs;

a carrier transporting mechanism for moving said carriers within said chamber;

an opening in said chamber through which at least one of the workstations is accessible to said plate-form discs delivered thereto;

a disc transporting mechanism for transporting individual ones of the plate-form discs within said chamber between said carriers and said accessible workstation; and driving means located outside said chamber and coupled to said disc transporting mechanism and said carrier transporting mechanism;

wherein the plate-form discs are stored vertically in the carriers, and wherein said disc transporting mechanism further comprises a swiveling mechanism comprising a tiltable receiving unit mounted within said chamber spaced from said support stations for securely retaining one of said carriers when delivered thereto by said carrier transporting mechanism, an other driving means mounted outside of said chamber for vertically rotating the receiving unit by 90° to position said receiving unit at only two stationary locations, one of said locations being for retaining said one of said carriers so that the plate-form discs therein are vertical, and the other of said locations being for placing said plate-form discs horizontal to enable access thereto by said tongue, and wherein said third driving mechanism is located outside said chamber.

28. Apparatus to handle, under ultra-clean conditions, plate-form discs for processing by workstations located within a room, comprising:

a chamber maintained under ultra-clean conditions;

a plurality of support stations mounted in said chamber for supporting a plurality of carriers, respectively, each of which stores a plurality of the plate-form discs;

a carrier transporting mechanism for moving said carriers within said chamber;

an opening in said chamber through which at least one of the workstations is accessible to said plate-form discs delivered thereto;

a disc transporting mechanism for transporting individual ones of the plate-form discs within said chamber between said carriers and said accessible workstation;

wherein each of the carriers carries a code unique thereto, and further comprising detection means for reading the code on each of the carriers; and driving means located outside said chamber and coupled to said detection means, said disc transporting mechanism and said carrier transporting mechanism.

29. Apparatus to handle, under ultra-clean conditions, plate-form discs stored in carriers for processing by workstations located within a room, comprising:

a carrier transporting mechanism for first engaging and then moving the carriers within said room;

a plurality of support stations mounted in said room for supporting a plurality of the carriers, respectively, each of which stores a plurality of the plate-form discs, each of said carriers carrying a code unique thereto; and a detector mounted on said carrier transporting mechanism for reading said code upon engagement of each of said carriers by said carrier transporting mechanism;

wherein said code is on a bottom portion of the carriers; and wherein said bottom portion is adapted to be received between elements of said detector, including a plurality of light emitting and sensing pairs, respectively, and said code is in the form of through openings formed in said bottom portion.

30. The apparatus of claim 29, wherein said through openings are in respective alignment with said light emitting and sensing pairs when each of said carriers is engaged by said carrier transporting mechanism.

31. Apparatus to handle, under ultra-clean conditions, plate-form discs for processing by workstations located within a room, comprising:

a chamber maintained under ultra-clean conditions;

a plurality of support stations mounted in said chamber in sequential alignment extending along a horizontal, or X, direction for supporting a plurality of carriers, respectively, each of which stores a plurality of the plate-form discs lying therein along a vertical, or Y, direction, said X and Y directions defining a working plane within said chamber;

a working head movably installed in said chamber and having a lifting portion adapted for engaging and transporting said carriers;

a transport mechanism comprising a first driving means mounted outside of said chamber for moving said working head in only said working plane, and a first coupler connecting said first driving means to said working head;

a swiveling mechanism comprising a tiltable receiving unit mounted within said chamber spaced from said rail and in said working plane for securely retaining one of said carriers when delivered thereto by said working head, second driving means mounted outside of said chamber for rotating the receiving unit by 90° in said working plane, and a second coupler connecting said second driving means to said receiving unit, wherein the driving means positions said receiving unit at only two stationary locations, one of said locations being for retaining one of said carriers so that the plate-form discs therein are vertical, and the other of said locations being for placing said plate-form discs horizontal;

an opening in said chamber within said working plane providing access to a workstation for plate-form discs delivered by said working head; and disc transport means mounted on said working head for transporting the plate-form discs between said carrier retained by the receiving unit and said workstation.

32. The apparatus of claim 31, wherein said plurality of support stations are portions of a rail extending in said X direction.

33. The apparatus of claim 31, wherein said disc transport means comprises a tongue.

34. The apparatus of claim 33, wherein said tongue has an opening in a surface thereof, adapted for engaging the disc, which is coupled through an interior of said tongue to a vacuum source.

35. The apparatus of claim 33, wherein said disc transport means further comprises a gripper.

* * * * *